United States Patent
Iorio et al.

(10) Patent No.: US 10,491,118 B2
(45) Date of Patent: Nov. 26, 2019

(54) HIGH VOLTAGE COMPARATOR WITH LOW-SENSITIVITY TO VARIATIONS OF PROCESS/TEMPERATURE AND SUPPLY

(71) Applicant: STMICROELECTRONICS S.R.L., Agrate Brianza (IT)

(72) Inventors: Alberto Iorio, Aosta (IT); Jeanpierre Vicquery, Brusson (IT); Emilio Volpi, Charvensod (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/457,599

(22) Filed: Mar. 13, 2017

(65) Prior Publication Data
US 2018/0091052 A1     Mar. 29, 2018

(30) Foreign Application Priority Data
Sep. 27, 2016   (IT) .................. 102016000096568

(51) Int. Cl.
*H02M 3/158*     (2006.01)
*H02M 1/32*      (2007.01)
(Continued)

(52) U.S. Cl.
CPC ...... *H02M 3/158* (2013.01); *G01R 19/16519* (2013.01); *H02M 1/32* (2013.01); *H03K 5/2481* (2013.01)

(58) Field of Classification Search
CPC .... H02M 3/156; H02M 3/158; H02M 3/1588; H02M 3/155; H02M 3/1582;
(Continued)

(56) References Cited

U.S. PATENT DOCUMENTS 5,321,324 A     6/1994   Hardee et al.
5,583,425 A *  12/1996   Rapp .................. H03F 3/45094
                                              323/316
(Continued)

FOREIGN PATENT DOCUMENTS

CN    101394168 A    3/2009
CN    101964648 A    2/2011
(Continued)

OTHER PUBLICATIONS

De Vita et al., "Ultra-Low-Power Flash Memory in Standard 0.35 µm CMOS for Passive Microwave RFID Transponders," 2006 IEEE International Symposium on Circuits and Systems, Island of Kos, Greece, May 21-24, 2006, 4 pages.

*Primary Examiner* — Yusef A Ahmed
*Assistant Examiner* — Bryan R Perez
(74) *Attorney, Agent, or Firm* — Seed Intellectual Property Law Group LLP

(57) ABSTRACT

A voltage comparator for detecting a voltage difference in a high-voltage domain, wherein said comparator receives an input voltage and compares it with a reference voltage also received in input, in which the output voltage from the comparator assumes the logic value 1 if the input voltage is greater than the reference voltage and assumes the logic value 0 if the input voltage is less than or equal to the reference voltage, wherein said comparator comprises low-voltage components and a single high-voltage component. In particular, the low-voltage components are MOS transistors and the high-voltage component is a high-voltage PMOS.

20 Claims, 7 Drawing Sheets

(51) Int. Cl.
*H03K 5/24* (2006.01)
*G01R 19/165* (2006.01)

(58) Field of Classification Search
CPC ...... H02M 3/157; H02M 3/1563; H02M 1/32; G01R 19/16519; H03K 5/2481
USPC ........ 323/288, 271, 282, 284–285, 311–313, 323/315
See application file for complete search history.

(56) References Cited

U.S. PATENT DOCUMENTS

| | | | |
|---|---|---|---|
| 5,793,193 A * | 8/1998 | Hodgins | H02M 3/1588 323/284 |
| 5,804,994 A | 9/1998 | Marlow et al. | |
| 6,028,457 A | 2/2000 | Tihanyi | |
| 7,116,136 B2 | 10/2006 | Honda et al. | |
| 9,086,711 B2 | 7/2015 | Diffenderfer et al. | |
| 2003/0012040 A1 | 1/2003 | Orita et al. | |
| 2005/0156636 A1 | 7/2005 | Makishima | |
| 2009/0102516 A1 | 4/2009 | Suzuki et al. | |
| 2010/0207666 A1 | 8/2010 | Nakahara | |
| 2014/0043562 A1 | 2/2014 | Kikuchi | |
| 2015/0162830 A1 * | 6/2015 | Dong | H02M 1/36 323/271 |
| 2015/0380400 A1 | 12/2015 | Jonishi | |
| 2016/0103463 A1 * | 4/2016 | Wang | G05F 3/262 323/313 |

FOREIGN PATENT DOCUMENTS

| | | |
|---|---|---|
| CN | 201955383 U | 8/2011 |
| CN | 102830271 A | 12/2012 |
| CN | 104919703 A | 9/2015 |

* cited by examiner

HIGH VOLTAGE COMPARATOR WITH LOW-SENSITIVITY TO VARIATIONS OF PROCESS/TEMPERATURE AND SUPPLY

BACKGROUND

Technical Field

The description relates to switching converters. One or more embodiments may be applied to DC-DC step-down converter circuits, also known as buck converters.

The description relates to solutions for detecting the voltage difference in a high-voltage domain without the need to use a high-voltage (HV) comparator, while maintaining the high precision typical of low-voltage (LV) structures.

Description of the Related Art

Typical solutions found in the literature make use of comparators in which the low-voltage (LV) components are protected by "cascode" structures implemented with high-voltage (HV) components, or voltage dividers which "scale down" the high-voltage (HV) voltages to be monitored into the range of operating voltages of the low-voltage (LV) components.

These solutions are usually limited to the comparison of a voltage with a reference $V_{REF}$.

As an example of a comparator, the conventional circuit of FIGS. 1 and 2 may be considered.

The comparator has a differential input pair of transistors $T_1$, $T_2$ formed by low-voltage (LV) components (FIG. 2), to reduce the offset of the comparator (and therefore the error on the threshold to be detected), a current mirror formed by transistors $T_3$, $T_4$, and a gain stage formed by a transistor $T_5$. The differential input pair $T_1$, $T_2$ are coupled by a first current generator $I_{B1}$ to a low supply voltage $V_{SUPPLY\_LV}$ and a second current generator $I_{B2}$ is coupled between the low supply voltage $V_{SUPPLY\_LV}$ and an output terminal that provides the output voltage $V_{out}$.

A solution which enables the high-voltage (HV) voltage $V_{IN}$ to be read is that of including in the circuit a resistive divider $R_1$–$R_2$ which "scales down" the voltage $V_{IN}$ into the operating range of the differential pair of the comparator:

$$V^{+}_{IN\_COMP} = V_{IN} \cdot \frac{R_2}{R_1 + R_2} \qquad (1)$$

The maximum limit on $V_{IN}$ is determined by the maximum voltage at which the LV devices of the differential input pair can operate. The non-ideal characteristics of the circuit (for example the offset voltage ($V_{io}$) of the comparator, the error on $V_{ref}$, the error in the resistive division ratio) introduce an error into the value of $V_{IN}$.

The solution using a resistive divider has the following drawbacks:

the offset voltage $V_{io}$ of the comparator, the error in the threshold $V_{ref}$ and the error in the ratio of the resistances $R_1/R_2$ are "amplified" by the division ratio itself, and are seen in combination as an error $V_{IN\_err}$ in the threshold of $V_{IN}$;

the resistive divider and the parasitic capacitance $C_{IN}$ on the input of the comparator introduce a delay; and a large number of components are used.

The contributions from the offset voltage $V_{io}$, the error in the threshold $V_{ref}$ and the error in the ratio of the resistances $R_1/R_2$ may be referred to generically as an additional error voltage $V_{err}$ on the V-node of the comparator.

The equivalent error resulting from this on the node $V_{IN}$ is:

$$V_{IN\_err} = V_{err} \cdot \left(1 + \frac{R_1}{R_2}\right) \qquad (2)$$

which increases with the difference between the HV and LV range (or the ratio $R_1/R_2$).

The delay introduced by the resistive divider and the parasitic capacitance $C_{IN}$ on the input of the comparator has a time constant $(R_1 \| R_2 \cdot C_{IN})$, which is manifested as an error in the threshold of $V_{IN}$. It should be noted that this delay is increased if low current consumption in the resistive divider is desired, and if $V_{IN}$ is high; in these cases, one should use higher resistance values (with a larger area and greater delay between $V_{IN}$ and $V_{IN\_COMP}$).

Another possible solution, shown in FIG. 3, provides for the use of cascode transistor structures ($T_A$, $T_B$, $T_C$ and $T_D$) to protect the LV structures (the current generator $I_{B1}$ and the differential pair $T_1$ and $T_2$). These cascode transistor structures ($T_A$, $T_B$, $T_C$ and $T_D$) are formed by high-voltage components.

The transistors $T_A$, $T_D$ and the first current generator $I_{B1}$ are coupled in series between the V-node of the comparator and ground. A differential stage is connected in series with the second current generator $I_{B2}$ between a high supply voltage $V_{SUPPLY\_HV}$ and ground. The differential stage has a first branch that includes the transistors $T_2$, $T_3$, and $T_B$ coupled in series between the second current generator $I_{B2}$ and ground and a second branch, coupled in parallel with the first branch, and including the transistors $T_1$, $T_4$ and $T_C$ coupled in series between the second current generator $I_{B2}$ and ground. A gain stage has a first branch that includes the transistor $T_5$ coupled in series with a transistor $T_7$ between the low supply voltage $V_{SUPPLY\_LV}$ and ground, and a second branch that includes a transistor $T_6$ coupled in series with a transistor $T_8$ between the low supply voltage $V_{SUPPLY\_LV}$ and ground. The transistors $T_7$, $T_8$ are connected to each other as a current mirror and the output terminal that provides the output voltage $V_{out}$ is connected to the common drain terminal of the transistors $T_6$, $T_8$.

The voltage $V_K$ is generated in such a way that transistors $T_1$ and $T_2$ see a voltage $V_{DS}$ which is always below the maximum level that they can withstand. In fact, if $V_+ = V_-$, we find:

$$V_K = V_- - |V_{GSA}| \qquad (3)$$

$$V_{D1} = V_K + |V_{GSC}| = V_{D2} = V_K + |V_{GSB}| \qquad (4)$$

While it is possible to define $$|V_{DS1}| = V_- + |V_{GS1}| - V_{D1} \qquad (5)$$

$$|V_{DS2}| = V_+ + |V_{GS2}| - V_{D2} \qquad (6)$$

where $T_A$, $T_B$ and $T_C$ are designed to have the same value of $V_{GS}$ when $V_+ = V_-$.

Therefore, substituting (3) and (4) in (5) and (6), we have:

$$|V_{DS1}| = V_- + |V_{GS1}| - (V_- - |V_{GSA}| + |V_{GSC}|) = |V_{GS1}| \qquad (7)$$

$$|V_{DS2}| = V_+ + |V_{GS2}| - (V_- - |V_{GSA}| + |V_{GSB}|) = V_+ - V_- + |V_{GS2}| = |V_{GS2}| \qquad (8)$$

The maximum value of the input voltage $V_+ - V_-$ can be found directly from equation (8). If $V_+ \neq V_-$, it must be ensured that $|V_{DS1}| < |V_{DS1}|_{MAX}$ and $|V_{DS2}| < |V_{DS2}|_{MAX}$ in order for $T_1$ and $T_2$ to operate correctly.

$$V_{IN}=V_+-V_-<|V_{DS2}|_{MAX}-|V_{GS2}| \quad (9)$$

The maximum value of the voltage $V_-$ depends on the voltage class ($|V_{DS}|_{MAX}$) of the high-voltage PMOS components ($T_A$, $T_B$ and $T_C$).

An analysis of the circuit shows that:

$$V_{DSC}=V_{GS4}-(V_K-V_{GSC}) \quad (10)$$

Bearing in mind the signs of the voltages and changing to absolute values, we find that:

$$-|V_{DSC}|=V_{GS4}-(V_K+|V_{GSC}|) \quad (11)$$

Substituting (3) in (11), we find that:

$$-|V_{DSC}|=V_{GS4}-(V_--|V_{GS4}|+|V_{GSC}|) \quad (12)$$

To avoid damaging the component $T_C$, the following condition should always be met: $|V_{DSC}|<|V_{DSC}|_{MAX}$ $^{|V_{DSC}|<|V_{DSC}|_{MAX}}$.

Given that the three high-voltage PMOS transistors are also designed to have the same $V_{GS}$, we find that:

$$|V_{DSC}|=-V_{GS4}+V_-<|V_{DSC}|_{MAX} \quad (13)$$

From which the maximum limit of the voltage V is found by recalculation:

$$V_-<|V_{DSC}|_{MAX}+V_{GS4} \quad (14)$$

The maximum limit on $V_+$ is directly obtained from (14) and (9)

$$V_+<|V_{DSC}|_{MAX}+|V_{DS2}|_{MAX}+V_{GS4}-|V_{GS2}|\approx|V_{DSC}|_{MAX}+|V_{DS2}|_{MAX} \quad (15)$$

A similar function is performed by $T_D$, provided that its source node is always below $V_{SUPPLY\_LV}-V_{GS\_MD}$ (the current generator $I_{B1}$ is usually made from LV components, for reasons of overall dimensions and precision of the bias current $I_{B1}$).

This second solution has the following drawbacks:
complexity of the circuit;
considerable use of HV components (affecting the area and response times of the circuit).

The known solutions therefore suffer from various disadvantages such as low precision, the need for devices with many high-voltage components with highly complex circuitry occupying a large amount of space, and low switching time.

BRIEF SUMMARY

It has therefore been found beneficial to operate with input voltages greater than the typical operating range of low-voltage (LV) devices, to provide the maximum benefit in terms of the matching/area ratio.

According to one or more embodiments, a device with low sensitivity to variations of the high-voltage (HV) power supply, to process parameters, and to temperature is employed.

In particular, the solution described herein relates to a buck switching DC-DC converter. This solution is used to detect a voltage difference in a high-voltage (HV) domain. The specifications concerning the voltage threshold are satisfied by maintaining low sensitivity to variations of the temperature, the process and the high-voltage (HV) power supply.

The solution may be used by the anti-discharging bootstrap capacitor system, for preventing the discharge of the bootstrap capacitor that is used for switching on the high-side power MOSFET.

The claims form an integral part of the description of embodiments provided herein.

One or more embodiments may offer one or more of the following advantages:
applicability to various applications, regardless of the components, parasitic quantities and external temperature, and
low cost, due to a reduction of the number of components.

BRIEF DESCRIPTION OF THE SEVERAL VIEWS OF THE DRAWINGS

One or more embodiments will now be described, purely by way of example, with reference to the appended drawings, of which.

DETAILED DESCRIPTION

The following description illustrates one or more specific details, intended to provide a better understanding of exemplary embodiments. The embodiments may be produced without one or more of the specific details, or with other procedures, components, materials, etc. In other cases, known structures, materials or operations are not illustrated or described in detail, in order to avoid obscuring certain aspects of the embodiments.

The reference to "an embodiment" in the present description is intended to indicate that a particular configuration, structure or characteristic described in relation to the embodiment is included in at least one embodiment. Thus phrases such as "in one embodiment" which may be present in one or more parts of the present description do not necessarily refer to the same embodiment. Furthermore, specific formations, structures or characteristics may be combined in any suitable way in one or more embodiments.

The references used herein are provided purely for convenience and therefore do not define the scope of protection or the extent of the embodiments.

Figure 5:
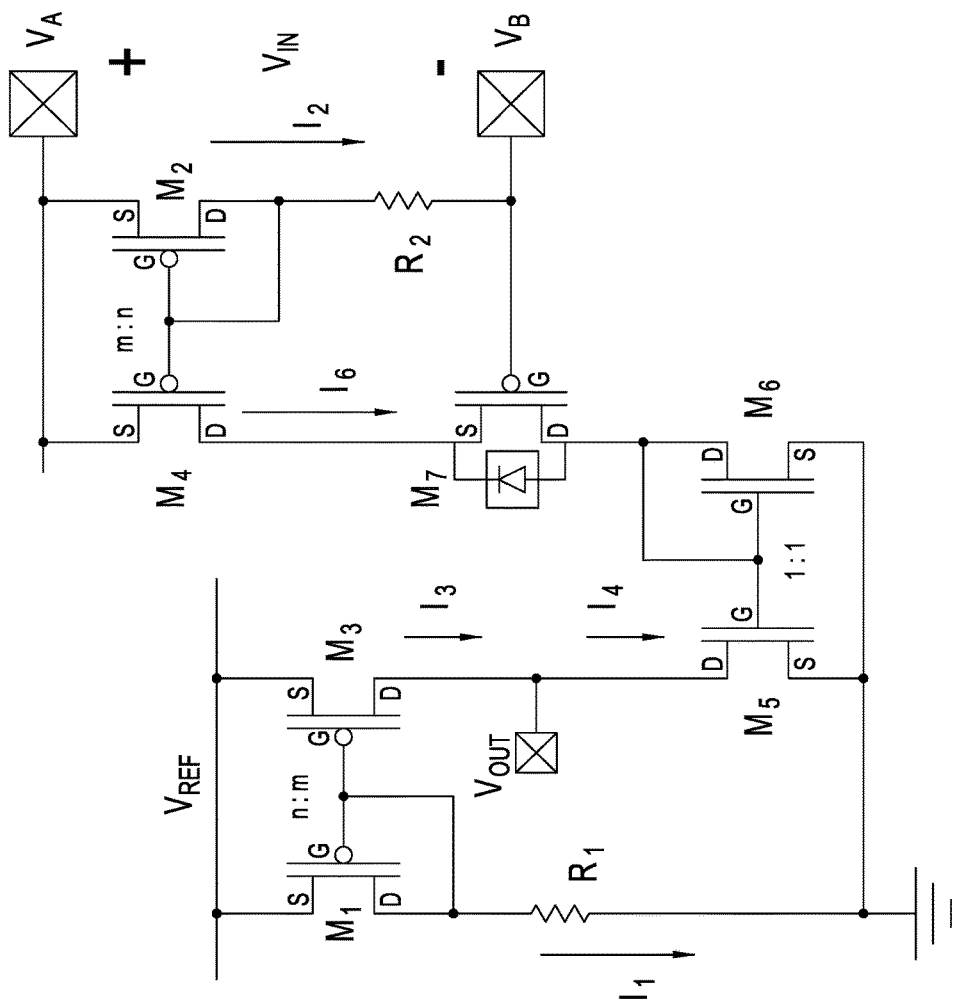

The comparator shown in FIG. 5 will be examined initially. An analysis of the circuit shows that:

$$V_{IN}=V_A-V_B \quad (16)$$

The comparator COMP is constructed to compare the voltage $V_{IN}$ with the reference voltage $V_{REF}$ so that the output voltage $V_{OUT}$ from the comparator COMP assumes the logic value 1 if relation (17) is satisfied, or the logic value 0 if relation (17) is not satisfied:

$$V_{IN}>V_{REF} \quad (17)$$

The second relation (17) may be rewritten on the basis of equation (16) in the following form:

$$V_A-V_B>V_{REF}V_A-V_B>V_{REF} \quad (18)$$

Figure 1:
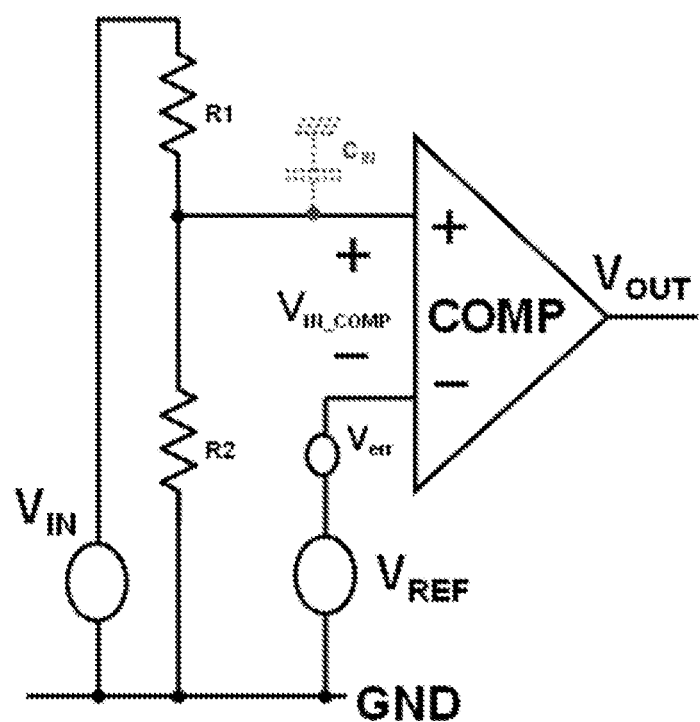
FIGS. 1 to 3, relating to the prior art, have already been described.
Figure 2:
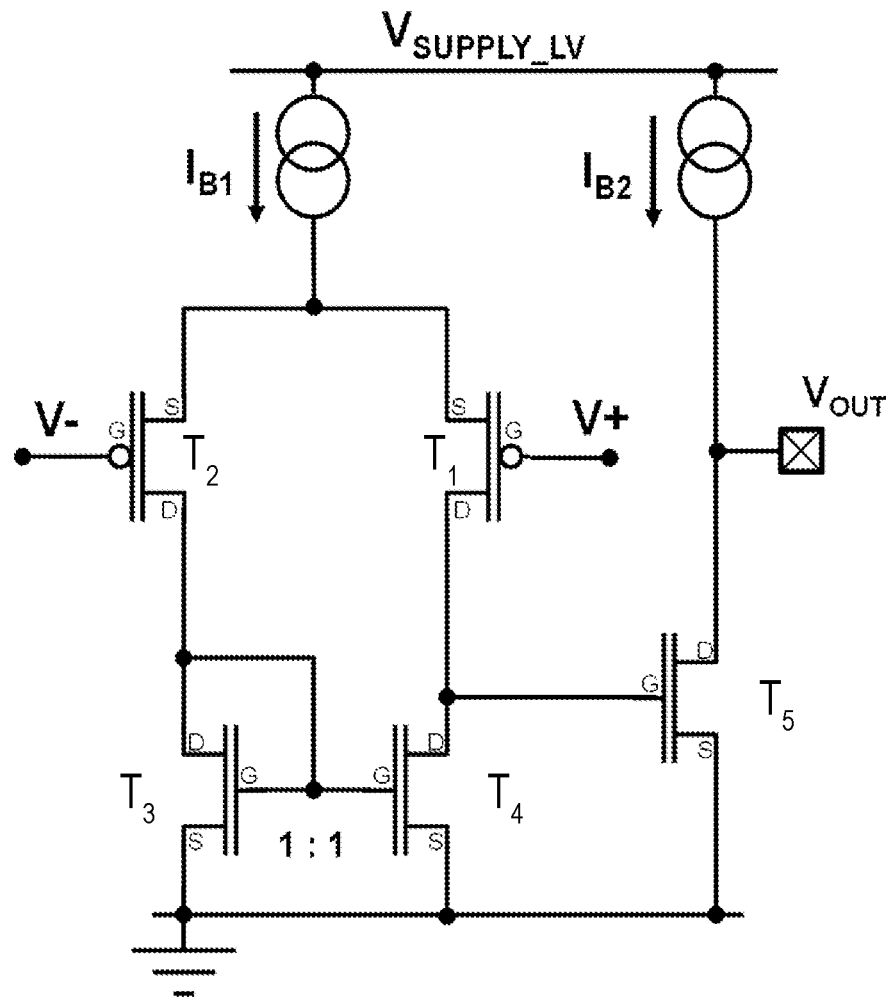
Figure 3:
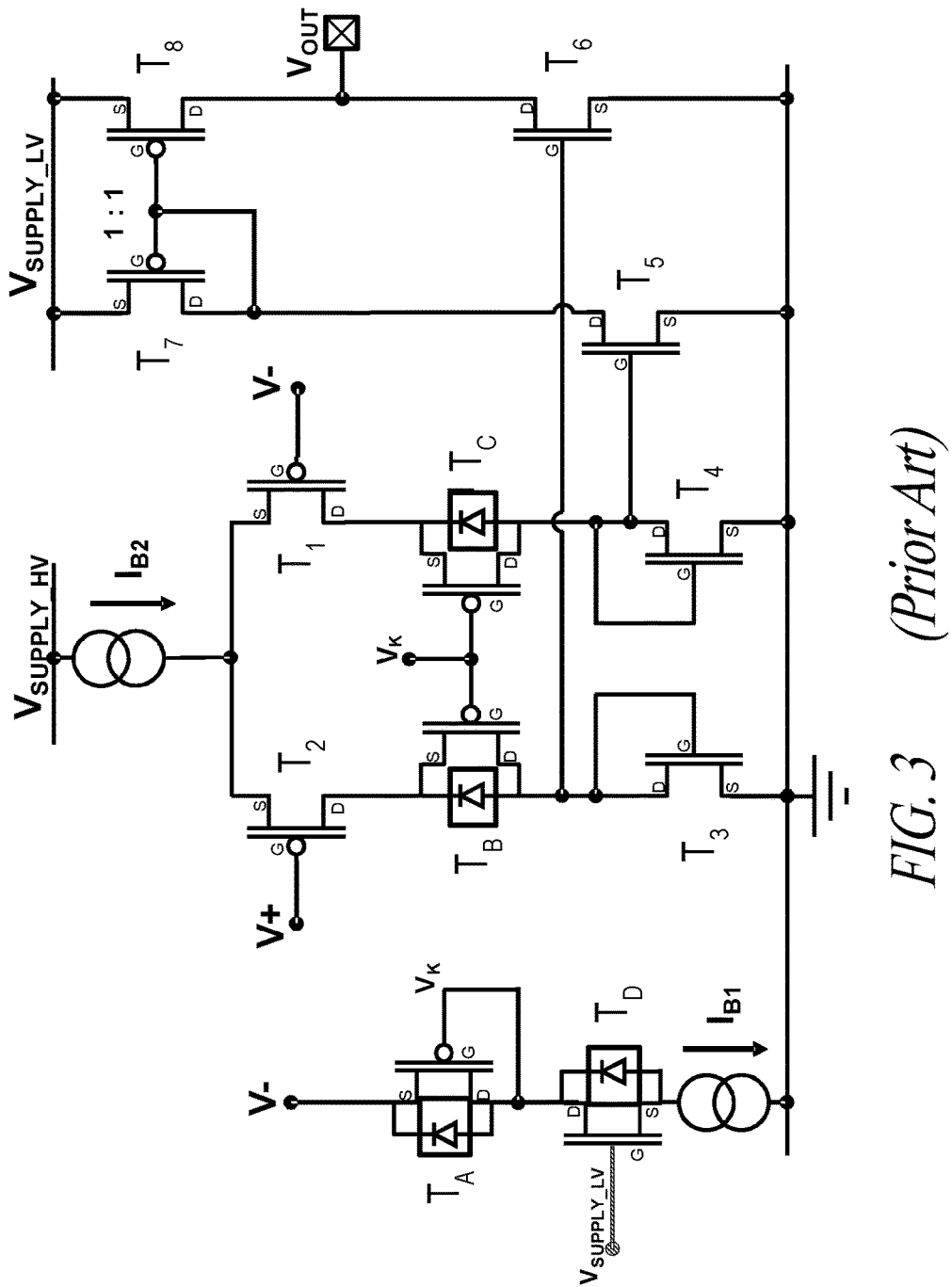
Figure 4:
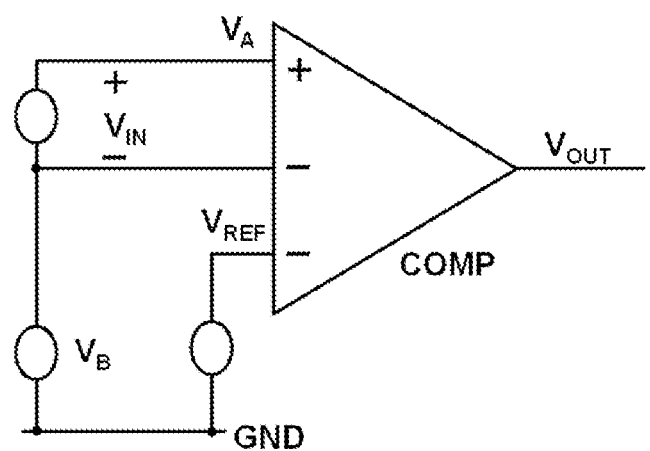
FIGS. 4 and 5 show a diagram and a circuit of a comparator according to one or more embodiments.

FIG. 5 is a detailed view of a possible exemplary embodiment of the comparator COMP of FIG. 4.

The comparator COMP includes PMOS (P-type Metal-Oxide-Semiconductor) transistors $M_{1-4}$ and NMOS (N-type Metal-Oxide-Semiconductor) transistors $M_{5-6}$ that are all are low-voltage (LV) components characterized by good performance in terms of the matching/area ratio. As used herein, low-voltage or LV components are components that are not designed to withstand voltages greater than 10, and are usually designed to operate with voltages less than 5V.

In one or more embodiments, the comparator COMP includes a transistor $M_7$ that is selected to be a high-voltage (HV) PMOS capable of withstanding a high voltage $|V_{DS}|$ which has a maximum value depending on the voltage class of the component and which is selected on the basis of the maximum absolute value of the voltages $V_A$ and $V_B$. As used herein, high-voltage or HV components are components designed to withstand voltages greater than 10V, and often much higher voltages, such as DMOS or other power transistors. These types of component are also available in standard BCD technology.

An analysis of the circuit of FIG. 5 shows that the output voltage $V_{OUT}$ assumes the logic value 1 if relation (19) is satisfied, and the logic value 0 if relation (19) is not satisfied:

$$I_3 > I_4 \quad (19)$$

where the pairs of transistors $M_1$-$M_3$, $M_2$-$M_4$ and $M_5$-$M_6$ are current mirrors with the current ratios shown in the diagram.

In one or more embodiments, assuming that all the components are operating in the saturation area, the following relations are true:

$$I_3 = \frac{m}{n} \cdot I_1 \quad (20)$$

$$I_6 = \frac{m}{n} \cdot I_2 \quad (21)$$

$$I_4 = I_6 \quad (22)$$

Substituting equation (21) in (22), we find that:

$$I_4 = \frac{m}{n} \cdot I_2 \quad (23)$$

Because of relations (20) and (23), relation (19) becomes:

$$\frac{m}{n} \cdot I_1 > \frac{m}{n} \cdot I_2 \quad (24)$$

Therefore, if we simplify by removing the term $$\frac{m}{n}$$

from both members, (24) may be rewritten thus:

$$I_1 > I_2 \quad (25)$$

The currents $I_1$ and $I_2$ depend on the value of the voltages $V_{REF}$ and $V_{IN}$ respectively.

In fact, the analysis of the circuit shows that:

$$I_1 = \frac{V_{REF} - |V_{GS1}|}{R_1} \quad (26)$$

$$I_2 = \frac{V_A - |V_{GS2}| - V_B}{R_2} = \frac{V_{IN} - |V_{GS2}|}{R_2} \quad (27)$$

In one or more embodiments, the two equations (26) and (27) are valid if the two transistors $M_1$ and $M_2$ are conducting (with $V_{REF}$ and $V_{IN}$ greater than the threshold voltage of the components $M_1$ and $M_2$), resulting in a minimum limit on the voltage $V_{REF}$ and $V_{IN}$ approximately equal to the threshold of a low-voltage device ($M_1$ and $M_2$ are low-voltage devices).

The absolute values are based on the fact that all the transistors $M_{1-4}$ are positive channel (PMOS) transistors.

The method for calculating the threshold voltage for one or more embodiments will now be described.

In the case of the output $V_{OUT}$ of the comparator of FIG. 4, we find that the logic value 1 (0) corresponds to the maximum (or minimum) value that the node $V_{OUT}$ can assume, equal to $V_{REF}$ and (0) respectively.

The threshold voltage of the comparator is, by definition, the value $V_{TH}$ assumed by the input voltage $V_{IN}$ for which the node $V_{OUT}=V_{REF}/2$. This condition is met when the two currents $I_3$ and $I_4$ are perfectly balanced according to equation (28) below:

$$I_3 = I_4 \quad (28)$$

Substituting equation (20) and equation (23) in equation (28), we obtain equation (29):

$$I_1 = I_2 \quad (29)$$

Finally, substituting equation (26) and equation (27) in (29), we find that:

$$\frac{V_{REF} - |V_{GS1}|}{R_1} = \frac{V_{IN} - |V_{GS2}|}{R_2} \bigg|_{V_{IN}=V_{TH}} \quad (30)$$

In one or more embodiments, it is possible to select the transistors $M_1$ and $M_2$ (and the resistors $R_1$ and $R_2$) so that they have the same geometrical dimensions and are of the same type. Therefore, because of equation (29) which is valid at the threshold of the comparator, we find that:

$$V_{GS1}=V_{GS2} V_{GS1}=V_{GS2} \quad (31)$$

$$R_1=R_2 \quad (32)$$

Substituting equation (31) and equation (32) in equation (30), we obtain:

$$\frac{V_{REF} - |V_{GS1}|}{R_1} = \frac{V_{IN} - |V_{GS1}|}{R1} \bigg|_{V_{IN}=V_{TH}} \quad (33)$$

$$\frac{V_{REF} - |V_{GS1}|}{R_1} = \frac{V_{IN} - |V_{GS1}|}{R_1} \bigg|_{V_{IN}=V_{TH}}$$

And, simplifying the common terms, we find that:

$$V_{REF}=V_{IN}|_{V_{IN}=V_{TH}}=V_{TH} \quad (34)$$

and therefore $$V_{TH}=V_{REF} \quad (35)$$

In particular, in one or more embodiments, the currents $I_1$ and $I_2$ depend in a similar way on the resistance $R_1$ (voltage $V_{GS1}$) and the resistance $R_2$ (voltage $V_{GS2}$) respectively.

In one or more embodiments, it is possible to select the resistors $R_1$ and $R_2$ (and the transistors $M_1$ and $M_2$) so that they are made with the same type of component (for example, polysilicon resistors, or PMOS of the same voltage class). In this case, that is to say if the resistors $R_1$ and $R_2$ and the transistors $M_1$ and $M_2$ are made with the same type of components, the currents $I_1$ and $I_2$ change in the same way when the temperature and process parameters vary.

In this condition, therefore, relation (30) remains valid even if there are variations in the temperature and process parameters.

To support this proposition, let us assume, by way of hypothesis, that there is a variation of temperature. This variation causes a change in the value of the resistances $R_1$ and $R_2$ of the comparator.

As a general rule, the value of the resistances $R_1$ and $R_2$ as a function of the temperature may normally be expressed as follows:

$$R_x = R_{x0} \cdot [1 + \alpha_x \cdot (T - T_0)] \quad (36)$$

where $R_{x0}$ is the value of the resistance $R_x$ at the temperature $T_0$, and $\alpha_x$ is a technological parameter which allows for the variation of $R_x$ as a function of the variation of temperature $(T - T_0)$, and is specific to the particular type of resistance used in these embodiments.

Given that both resistances $R_1$ and $R_2$ are actually at the same temperature $T_0$, since they are physically constructed to be close together on the same integrated device, and given equation (36), we may rewrite equation (30) as follows:

$$\frac{V_{REF} - |V_{GS1}|}{R_{10} \cdot [1 + \alpha_1 \cdot (T - T_0)]} = \frac{V_{IN} - |V_{GS2}|}{R_{20} \cdot [1 + \alpha_2 \cdot (T - T_0)]}\bigg|_{V_{IN}=V_{TH}} \quad (37)$$

Therefore, in the aforesaid embodiments, given that $R_1$ and $R_2$ are of the same type (or $\alpha_1 = \alpha_2$), and assuming that they also have the same value and geometry (or $R_{10} = R_{20}$), then (37) becomes:

$$\frac{V_{REF} - |V_{GS1}|}{R_{10} \cdot [1 + \alpha_1 \cdot (T - T_0)]} = \frac{V_{IN} - |V_{GS2}|}{R_{10} \cdot [1 + \alpha_1 \cdot (T - T_0)]}\bigg|_{V_{IN}=V_{TH}} \quad (38)$$

from which, by simplifying, we again obtain equation (34) and equation (35), but this time on the assumption of a variation in temperature.

An identical argument may be made regarding the dependence of the resistances on the process parameters, and the dependence of the voltages $V_{GS}$ on the temperature and the process parameters.

In various embodiments, the tripping threshold of the comparator is therefore independent of variations in the process parameters and the temperature.

A further advantageous result is that the tripping threshold $V_{TH}$ is independent of the absolute value of the voltages $V_A$ and $V_B$ (see FIG. 5), and is dependent only on their difference $V_{IN}$, making it possible to use the comparator between two different power supply voltage domains (for example, with $V_A$ and $V_B$ belonging to a high-voltage (HV) domain and $V_{REF}$ belonging to a low-voltage (LV) domain).

Given the above information, the maximum limit values of the voltages $V_A$, $V_B$ and $V_{IN}$ can be calculated.

The limits on the values of the voltages $V_A$, $V_B$ and on their difference $V_{IN}$ may also be found by analysing the circuit of FIG. 5.

In one or more embodiments, in the case of the voltage $V_B$ the limit is set by the voltage class ($|V_{DS7}|_{MAX}$) of the transistor component $M_7$, while in the case of the voltage $V_{IN}$ the limit is set by the voltage class ($|V_{DS4}|_{MAX}$) of the transistor component $M_4$.

For the voltage $V_A$, the limit is deduced from the two preceding limits.

In particular, in one or more embodiments, the maximum limit of the voltage $V_B$ is set by the value $|V_{DS}|_{MAX}$ of the component $M_7$.

In fact, the analysis of the circuit of FIG. 5 shows that:

$$V_{DS7} = V_{GS6} - (V_B - V_{GS7}) \quad (39)$$

Bearing in mind the signs of the voltages and changing to absolute values, we may write:

$$-|V_{DS7}| = V_{GS6} - (V_B + |V_{GS7}|) - |V_{DS7}| = V_{GS6} - (V_B + |V_{GS7}|) \quad (40)$$

In one or more embodiments, in order to avoid damaging the transistor component $M_7$ (an HV component), the condition $$|V_{DS7}| < |V_{DS7}|_{MAX}{}_{|V_{DS7}|<|V_{DS7}|_{MAX}}$$

must always be met, and therefore:

$$|V_{DS7}| = -V_{GS6} + (V_B + |V_{GS7}|) < |V_{DS7}|_{MAX} \quad (41)$$

Recalculating on the basis of equation (41), the maximum limit of the voltage $V_B$ is found:

$$V_B < |V_{DS7}|_{MAX} + V_{GS6} - V_{GS7} \quad (42)$$

and if $V_{GS6}$ and $|V_{GS7}|$ are comparable and $V_{GS6} - |V_{GS7}| \ll |V_{DS7}|_{MAX}$, this limit can be approximated as:

$$V_B < |V_{DS7}|_{MAX} \quad (43)$$

Additionally, in one or more embodiments, the maximum limit of the voltage $V_{IN}$ is set by the value $|V_{DS}|_{MAX}$ of the transistor component $M_4$ (an LV component); in fact, an analysis of the circuit shows that $$V_{DS4} = V_B - V_{GS7} - V_A \quad (44)$$

Bearing in mind the signs of the voltages and changing to absolute values, we find that:

$$-|V_{DS4}| = +|V_{GS7}| - (V_A - V_B) = +|V_{GS7}| - V_{IN} \quad (45)$$

To avoid damaging the transistor component $M_4$, the condition $|V_{DS4}| < |V_{DS4}|_{MAX}{}^{|V_{DS4}|<|V_{DS4}|_{MAX}}$ must always be met, and therefore $$|V_{DS4}| = -|V_{GS7}| + V_{IN} < |V_{DS4}|_{MAX} \quad (46)$$

$$|V_{DS4}| = -|V_{GS7}| + V_{IN} < |V_{DS7}|_{MAX}$$

Consequently, the maximum limit of the voltage $V_{IN}$ is found by recalculation:

$$V_{IN} < |V_{DS4}|_{MAX} + |V_{GS7}| \quad V_{IN} \leq |V_{DS4}|_{MAX} + |V_{GS7}| \quad (47)$$

Using equations (42) and (47), we obtain the maximum value of $V_A$, or:

$$V_A < V_B|_{MAX} + V_{IN}|_{MAX} = |V_{DS7}|_{MAX} + |V_{DS4}|_{MAX} + V_{GS6} \quad (48)$$

It follows from the above exposition that the high-voltage transistor component $M_7$ has the function of protecting the low-voltage transistor component $M_4$, and makes it possible to operate with input voltages $V_A$ and $V_B$ belonging to a different high-voltage domain from that of the low-voltage transistor components $M_1$ and $M_3$. The high-voltage transistor component $M_7$, if suitably designed, enables the values $V_{DS}$ of the components $M_2$ and $M_4$ to be equalized at the tripping threshold of the comparator.

This condition provides a more accurate mirror ratio between the currents $I_2$ and $I_6$ (this ratio usually shows an absolute error depending on the different between the voltages $V_{DS2}$ and $V_{DS4}$), thereby reducing the variability of the tripping threshold $V_{TH}$ of the comparator.

The threshold $V_{TH}$ of the comparator is therefore dependent only on the difference $V_A-V_B$, and is independent of the temperature and the process variations.

The threshold $V_{TH}$ is affected by the matching errors associated with the current mirrors, although these errors, unlike the temperature and the variation in process parameters, are under the control of the designer, who may, for example, select quantities such as the width and length (W/L) of the transistors and resistances.

An example of application of the described circuit will now be described with reference to FIG. 6. Additionally, FIG. 7 shows the variation of the input and output signals of the comparator.

Figure 6:
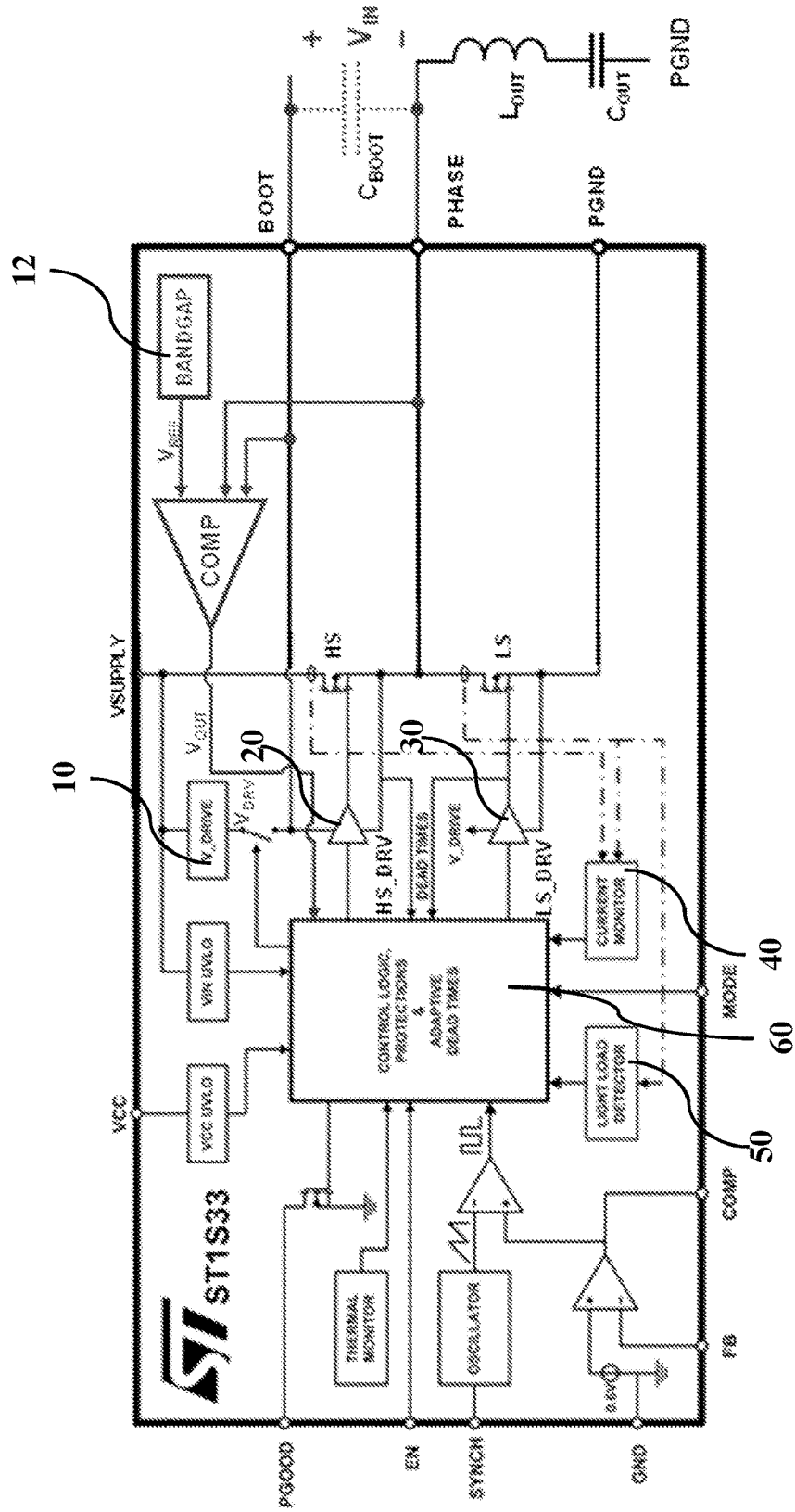
FIGS. 6 and 7 show an example of application of the circuit described, and the variation of the input/output signals of the comparator.
Figure 7:
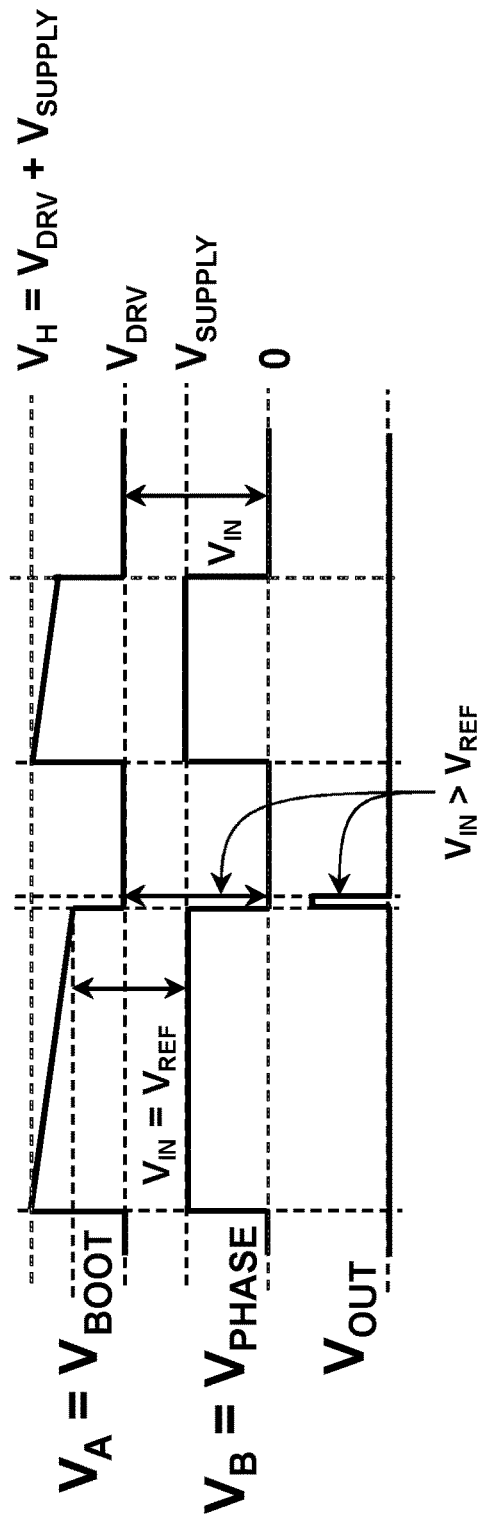

In particular, FIG. 6 shows a block diagram of a DC-DC buck converter device developed by the present applicant, using a comparator COMP as described.

The purpose of the DC-DC buck converter device is to generate a virtually constant output voltage from the supply voltage $V_{SUPPLY}$ while maximizing the conversion efficiency. For this purpose, the system generates a square wave at the PHASE node with a duty cycle variable between the voltages of 0 and $V_{SUPPLY}$.

The square wave is generated by periodically switching on and off the LS (Low-Side) and HS (High-Side) power MOS transistors, which are both N-type.

In order to switch on the HS transistor and bring the PHASE node to the voltage $V_{SUPPLY}$, a voltage $V_H$, which exceeds $V_{SUPPLY}$, at least by the threshold voltage $V_{TH\_H}$s of the HS transistor, is generated at the gate. This voltage is obtained by means of the circuit V_DRIVE circuit 10, which charges the external capacitance $C_{BOOT}$ connected between the BOOT and PHASE nodes to the voltage $V_{DRV}$, while supplying the drive circuit HS_DRV 20 with the voltage of the BOOT node.

With reference to FIG. 7, when the PHASE node is at the 0 level, the HS transistor is off.

At the instant when the HS transistor is switched on, the PHASE voltage starts to rise. The BOOT node will rise in the same way, owing to the presence of the capacitance $C_{BOOT}$ charged to the voltage $V_{DRV}$.

The drive circuit HS_DRV 20 continues to keep the HS switched on, since it "floats" between the BOOT and PHASE voltages. This transient ends at the moment when the PHASE and BOOT voltages reach the values of $V_{SUPPLY}$ and $V_{SUPPLY}+V_{DRV}$ respectively (for higher values of PHASE, the HS transistor tends to be switched off).

The comparator described above generates a high voltage on the $V_{OUT}$ node whenever the voltage $V_{IN}$=BOOT−PHASE at the terminals of the capacitance $C_{BOOT}$ is below the threshold $V_{REF}=V_{TH\_HS}$, thereby ensuring that the voltage $V_{BOOT}$ is always sufficiently high to allow the HS transistor to be switched on.

It should be noted that the capacitance $C_{BOOT}$ tends to become discharged because of the leakage currents present at the BOOT node, as shown in FIG. 7.

The generation of $V_{REF}$ does not require any ad-hoc circuit in addition to those normally present in this type of device. In fact, this voltage can simply be obtained by means of the BANDGAP type circuit 12 which is already present and is used to perform other system functions.

The converter device comprises other modules such as a current monitor block 40 and a light load detector 50, the outputs of which supply a control logic unit 60, which controls the high-side and low-side drivers 20, 30 and protects those drives by adaptive setting dead times so that the HS and LS transistors are not on simultaneously.

The comparator COMP according to one or more embodiments does not include more than one high-voltage component ($M_7$). Consequently there is less occupation of space and it is possible to operate with different HV domains, limited solely by the voltage class of the component $M_7$.

The comparator does not require additional currents to those of the mirrors (for biasing a voltage divider to scale down the HV voltages into the LV range, for example).

The power supply domain of $V_A$ and $V_B$ is independent of that of the voltage $V_{REF}$.

The threshold $V_{TH}$ does not depend on the absolute value of $V_A$ and $V_B$, but only on their difference.

The comparator COMP provides fast switching times, because the comparison is performed in current, not in voltage.

The threshold of the comparator does not depend on the temperature and the process parameters, but only on matching errors which are under the control of the designer.

In FIG. 7, it is possible to note the transition of $V_{out}$ to the logic value 1 when the condition $V_{IN}>V_{REF}$ is met, and its return to (0) when the condition $V_{IN}<V_{REF}$ is met.

Thus the solution described here offers the following advantages:

the threshold of the comparator does not depend on the variations of process and/or temperature;
the threshold of the comparator does not depend on the HV voltage;
the threshold of the comparator depends on the matching errors of the LV device (which are much smaller than those of the HV device);
the threshold of the comparator depends on design choices or on the choice of values of the resistances and the transistors (W, L, I);
there is only one HV device, resulting in low occupation of space;
a fast switching time, compared with existing structures and structures consisting only of LV components;
low energy consumption;
the comparator may operate with two independent power supplies (HV/LV); and
the detection of the voltage difference in the HV domain depends on an LV voltage reference.

The circuit may also be used to detect the voltage difference in an LV domain.

Therefore, the threshold of the comparator depends on the low-voltage (LV) supply voltage ($V_{REF}$).

With the proposed solution, the detection of the HV voltage difference is converted into the comparison of two currents in an LV domain.

In the embodiments described, selecting components of the same type ensures that the currents are generated in the same way, resulting in a low dependence on the variations of process, temperature and HV supply.

Provided that the basic principle remains the same, the details and the forms of embodiment may be varied to a more or less significant extent with respect to those which have been described purely by way of non-limiting example, without thereby departing from the scope of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A voltage comparator, comprising:
a first input terminal configured to receive a first input voltage;
a second input terminal configured to receive a second input voltage;
a reference terminal configured to receive a reference voltage;
a first transistor having a control terminal electrically coupled to the first input terminal and a first conduction terminal electrically coupled to the second input terminal, the first transistor being configured to be controlled by the first input voltage and provide a first current that is proportional to a voltage difference between the first and second input voltages;
a second transistor having a first conduction terminal coupled to the reference terminal and configured to provide a second current that is proportional to the reference voltage;
a first current mirror coupled between the first and second transistors and configured to provide a third current that is proportional to the first current and
an output terminal configured to receive the second and third currents and provide the output voltage based on a comparison of the second and third currents.

2. The voltage comparator of claim 1,
wherein the output terminal of the voltage comparator outputs a logic high value when the second current is larger than the third current, and outputs a logic low value when the second current is smaller than the third current.

3. The voltage comparator of claim 2, further comprising:
a third transistor electrically coupled between the first and second input terminals and configured to provide a fourth current;
a fourth transistor coupled in series with the first transistor and forming a second current mirror with the third transistor; and
a first resistor coupled in series with the third transistor between the first and second input terminals.

4. The voltage comparator of claim 3, further comprising:
a fifth transistor forming a third current mirror with the second transistor; and
a second resistor coupled in series with the fifth transistor between the reference voltage terminal and a ground terminal.

5. The voltage comparator of claim 4, wherein the first current mirror includes:
a sixth transistor electrically coupled in series with the second transistor between the reference terminal and the ground terminal; and
a seventh transistor coupled in series with the first and fourth transistors and having a control terminal directly connected to a control terminal of the sixth transistor.

6. The voltage comparator of claim 5, wherein:
the first and second resistors have substantially equal resistances and the first, second, and third current mirrors have respective mirror ratios that are configured to ensure that the fourth current, through the first resistor and third transistor, substantially equals a fifth current through the second resistor and fifth transistor.

7. The voltage comparator of claim 5, wherein the first transistor is a high-voltage transistor and the second, third, fourth, fifth, sixth, and seventh transistors are low-voltage transistors.

8. A DC-DC converter controller, comprising:
a power switch element configured to provide an output drive voltage; and
a comparator that includes:
a first input terminal configured to receive the output drive voltage from the power switch element as a first input voltage;
a second input terminal configured to receive a second input voltage;
a reference terminal configured to receive a reference voltage;
a first transistor having a control terminal electrically coupled to the first input terminal and a first conduction terminal electrically coupled to the second input terminal, the first transistor being configured to be controlled by the first input voltage and provide a first current that is proportional to a voltage difference between the first and second input voltages;
a second transistor having a first conduction terminal coupled to the reference terminal and configured to provide a second current that is proportional to the reference voltage;
a first current mirror coupled between the first and second transistors and configured to provide a third current that is proportional to the first current; and
an output terminal configured to receive the second and third currents and provide the output voltage based on a comparison of the second and third currents.

9. The DC-DC converter controller of claim 8, wherein the output terminal of the comparator outputs a logic high value when the second current is larger than the third current, and outputs a logic low value when the second current is smaller than the third current.

10. The DC-DC converter controller of claim 9, wherein the comparator includes:
a third transistor electrically coupled between the first and second input terminals and configured to provide a fourth current;
a fourth transistor coupled in series with the first transistor and forming a second current mirror with the third transistor; and
a first resistor coupled in series with the third transistor between the first and second input terminals.

11. The DC-DC converter controller of claim 10, wherein the comparator includes:
a fifth transistor forming a third current mirror with the second transistor; and
a second resistor coupled in series with the fifth transistor between the reference voltage terminal and a ground terminal.

12. The DC-DC converter controller of claim 11, wherein the first current mirror includes:
a sixth transistor electrically coupled in series with the second transistor between the reference terminal and the ground terminal; and
a seventh transistor coupled in series with the first and fourth transistors and having a control terminal directly connected to a control terminal of the sixth transistor.

13. The DC-DC converter controller of claim 12, wherein:
the first and second resistors have substantially equal resistances and the first, second, and third current mirrors have respective mirror ratios that are configured to ensure that the fourth current, through the first resistor and third transistor, substantially equals a fifth current through the second resistor and fifth transistor.

14. The DC-DC converter controller of claim 8, further comprising:
   a switch driver configured to control the switch element and receive power from the second input voltage; and
   a control logic circuit configured to control the switch driver based in part on the output voltage provided by the comparator.

15. A DC-DC converter, comprising:
   a bootstrap capacitor; and
   a DC-DC converter controller that includes:
      a power switch element configured to provide an output drive voltage for driving the inverter circuit; and
      a comparator that includes:
         a first input terminal configured to receive the output drive voltage from the power switch element as a first input voltage;
         a second input terminal configured to receive a second input voltage from the bootstrap capacitor, the bootstrap capacitor being connected to the first and second input terminal;
         a reference terminal configured to receive a reference voltage;
         a first transistor having a control terminal electrically coupled to the first input terminal and a first conduction terminal electrically coupled to the second input terminal, the first transistor being configured to be controlled by the first input voltage and provide a first current that is proportional to a voltage difference between the first and second input voltages;
         a second transistor having a first conduction terminal coupled to the reference terminal and configured to provide a second current that is proportional to the reference voltage;
         a first current mirror coupled between the first and second transistors and configured to provide a third current that is proportional to the first current; and
         an output terminal configured to receive the second and third currents and provide the output voltage based on a comparison of the second and third currents.

16. The DC-DC converter of claim 15, wherein the output terminal of the comparator of the DC-DC converter controller outputs a logic high value when the second current is larger than the third current, and outputs a logic low value when the second current is smaller than the third current.

17. The DC-DC converter of claim 16, wherein the comparator includes:
   a third transistor electrically coupled between the first and second input terminals and configured to provide a fourth current;
   a fourth transistor coupled in series with the first transistor and forming a second current mirror with the third transistor; and
   a first resistor coupled in series with the third transistor between the first and second input terminals.

18. The DC-DC converter of claim 17, wherein the comparator includes:
   a fifth transistor forming a third current mirror with the second transistor; and
   a second resistor coupled in series with the fifth transistor between the reference voltage terminal and a ground terminal.

19. The DC-DC converter of claim 18, wherein the first current mirror includes:
   a sixth transistor electrically coupled in series with the second transistor between the reference terminal and the ground terminal; and
   a seventh transistor coupled in series with the first and fourth transistors and having a control terminal directly connected to a control terminal of the sixth transistor.

20. The DC-DC converter of claim 19, wherein:
   the first and second resistors have substantially equal resistances and the first, second, and third current mirrors have respective mirror ratios that are configured to ensure that the fourth current, through the first resistor and third transistor, substantially equals a fifth current through the second resistor and fifth transistor.

* * * * *